(12) United States Patent
Schumann et al.

(10) Patent No.: US 9,992,504 B2
(45) Date of Patent: Jun. 5, 2018

(54) CODING METHOD FOR DATA COMPRESSION OF POWER SPECTRA OF AN OPTOELECTRONIC COMPONENT AND DECODING METHOD

(71) Applicant: OSRAM Opto Semiconductors GmbH, Regensburg (DE)

(72) Inventors: Michael Schumann, Neu-Ulm (DE); Ludwig Plötz, Arnschwang (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 166 days.

(21) Appl. No.: 15/110,651

(22) PCT Filed: Jan. 29, 2015

(86) PCT No.: PCT/EP2015/051790
§ 371 (c)(1),
(2) Date: Jul. 8, 2016

(87) PCT Pub. No.: WO2015/114042
PCT Pub. Date: Aug. 6, 2015

(65) Prior Publication Data
US 2016/0330465 A1 Nov. 10, 2016

(30) Foreign Application Priority Data
Feb. 3, 2014 (DE) ........................ 10 2014 101 307

(51) Int. Cl.
*G06K 9/00* (2006.01)
*H04N 19/426* (2014.01)
(Continued)

(52) U.S. Cl.
CPC ......... *H04N 19/426* (2014.11); *G06K 9/4671* (2013.01); *G06K 9/52* (2013.01);
(Continued)

(58) Field of Classification Search
CPC .... H04N 19/426; H04N 19/90; H04N 19/136; H04N 19/44; G06K 9/52; G06K 9/4671; H03M 7/30; G06T 9/007
See application file for complete search history.

(56) References Cited

U.S. PATENT DOCUMENTS

| 5,311,445 A | 5/1994 | White |
| 5,640,423 A * | 6/1997 | Archer ............... H04L 27/2637 332/103 |

(Continued)

FOREIGN PATENT DOCUMENTS

| GB | 2139046 A | 10/1984 |
| JP | S63212828 A | 9/1988 |

(Continued)

OTHER PUBLICATIONS

Kamshilin, A. et al., "Chromatic Discrimination by Use of Computer Controlled Set of Light-Emitting Diodes", Optics Express, Nov. 2007, 8 pages, vol. 15, No. 23.

(Continued)

*Primary Examiner* — Aaron W Carter
(74) *Attorney, Agent, or Firm* — Slater Matsil, LLP

(57) ABSTRACT

A coding method for data compression of a power spectra of an optoelectronic component and a decoding method are disclosed. In an embodiment, a coding method includes providing a power spectrum, sampling the power spectrum at particular sampling wavelengths in order to provide a discrete source spectrum, indexing the discrete source spectrum in order to provide a source graph having discrete source values, producing an image graph having discrete image values by transforming the source graph from a source range into an image range with a discrete frequency (Continued)

transform, performing compression of the image graph, and digitizing the compressed image graph in order to produce compressed spectral data.

20 Claims, 11 Drawing Sheets

(51) Int. Cl.
- G06T 9/00 (2006.01)
- H03M 7/30 (2006.01)
- H04N 19/136 (2014.01)
- H04N 19/44 (2014.01)
- H04N 19/90 (2014.01)
- G06K 9/46 (2006.01)
- G06K 9/52 (2006.01)

(52) U.S. Cl.
CPC .............. *G06T 9/007* (2013.01); *H03M 7/30* (2013.01); *H04N 19/136* (2014.11); *H04N 19/44* (2014.11); *H04N 19/90* (2014.11)

(56) References Cited

U.S. PATENT DOCUMENTS

| | | | |
|---|---|---|---|
| 6,408,275 B1* | 6/2002 | Bastin | H03M 7/30 704/211 |
| 6,434,496 B1 | 8/2002 | Dong et al. | |
| 7,318,027 B2 | 1/2008 | Lennon et al. | |
| 7,409,115 B2 | 8/2008 | Zeng et al. | |
| 9,754,601 B2* | 9/2017 | Hirschfeld | G10L 19/06 |
| 9,860,097 B2* | 1/2018 | Kawakami | H04L 27/22 |
| 2001/0033406 A1* | 10/2001 | Koike | H04B 10/00 398/128 |
| 2002/0057431 A1 | 5/2002 | Fateley et al. | |
| 2002/0113880 A1 | 8/2002 | Iida et al. | |
| 2003/0072464 A1* | 4/2003 | Kates | G10H 1/125 381/312 |
| 2004/0170104 A1* | 9/2004 | Ernest | G11B 20/10 369/59.24 |
| 2009/0082919 A1* | 3/2009 | Hershey | F02D 41/249 701/33.4 |
| 2009/0254783 A1* | 10/2009 | Hirschfeld | G10L 19/0017 714/701 |
| 2010/0188733 A1* | 7/2010 | Mottay | H01S 3/0057 359/340 |
| 2010/0278526 A1* | 11/2010 | Duan | H04B 1/74 398/5 |
| 2012/0134426 A1 | 5/2012 | Sole et al. | |
| 2012/0326054 A1 | 12/2012 | Meloni | |
| 2013/0083312 A1* | 4/2013 | Baraniuk | G01J 3/2823 356/51 |
| 2013/0215961 A1* | 8/2013 | Nakagawa | H04N 19/126 375/240.03 |
| 2014/0101485 A1* | 4/2014 | Wegener | H03M 7/3068 714/32 |
| 2015/0077535 A1* | 3/2015 | Izatt | G02B 21/086 348/79 |
| 2016/0005420 A1* | 1/2016 | Furuta | G10L 21/0364 704/205 |
| 2016/0172815 A1* | 6/2016 | Kim | G02F 1/3513 356/479 |
| 2016/0330465 A1* | 11/2016 | Schumann | G06T 9/007 |
| 2017/0142809 A1* | 5/2017 | Paolini | H05B 37/0272 |

FOREIGN PATENT DOCUMENTS

| | | |
|---|---|---|
| JP | S63315923 A | 12/1988 |
| JP | 2000193524 A | 7/2000 |
| JP | 2000276194 A | 10/2000 |
| JP | 2001099710 | 4/2001 |
| JP | 2006518873 A | 8/2006 |
| JP | 2007526691 A | 9/2007 |
| JP | 2008501949 A | 1/2008 |
| JP | 2013502822 A | 1/2013 |
| WO | 0227285 A1 | 4/2002 |
| WO | 2007140585 A1 | 12/2007 |
| WO | 2010118160 A1 | 10/2010 |

OTHER PUBLICATIONS

Wirth, G. et al., "Fuzzy Classification Algorithms for Analysis of Polymer Spectra", Proceedings of the Fifth IEEE International Conference on Fuzzy Systems, Sep. 8-11, 1996, pp. 1339-1343, vol. 2, New Orleans, LA.

Kamshilin, A. et al., "Chromatic Discrimination by Use of Computer Controlled Set of Light-Emitting Diodes", Optics Nov. 2007, 8 pages, vol. 15, No. 23.

LED Metrology; "Handbook of LED Metrology", Instrument Systems GMBH, Sep. 10, 2009, 42 pages.

Wirth, G. et al., "Fuzzy Classification Algorithms for Analysis of Polymer Spectra", Proceedings of the Fifth IEEE Conference on Fuzzy Systems, Sep. 8-11, 1996, pp. 1339-1343, vol. 2, New Orleans, LA.

Agilent Technologies; "Accurate Characterization of Source Spectra Using an Optical Spectrum Analyzer", Application Note 1550-5, Dec. 30, 2001, 14 pages.

\* cited by examiner

FIG 10

| Data String | Bit Depth |
|---:|---:|
| 98 | 8 |
| 167 | 8 |
| 327 | 10 |
| -161 | 10 |
| -67 | 10 |
| -94 | 10 |
| 159 | 10 |
| -362 | 10 |
| -60 | 10 |
| -38 | 10 |
| 209 | 9 |
| 22 | 9 |
| 15 | 9 |
| -146 | 9 |
| -49 | 9 |
| 115 | 9 |
| -184 | 9 |
| -20 | 9 |
| 6 | 8 |
| 108 | 8 |
| -54 | 8 |
| -6 | 8 |
| -44 | 8 |
| 67 | 8 |
| -13 | 8 |
| 13 | 8 |
| 2 | 7 |
| -5 | 7 |

Rows 1-2 bracketed as I; rows 3-end bracketed as II.

ized. The data must in this case be communicated to the
CODING METHOD FOR DATA COMPRESSION OF POWER SPECTRA OF AN OPTOELECTRONIC COMPONENT AND DECODING METHOD This patent application is a national phase filing under section 371 of PCT/EP2015/051790, filed Jan. 29, 2015, which claims the priority of German patent application 10 2014 101 307.7, filed Feb. 3, 2014, each of which is incorporated herein by reference in its entirety.

TECHNICAL FIELD

The invention relates to a method for compressing one or more power spectra of an optoelectronic component, and to a method for decompressing the power spectra.

BACKGROUND

Optoelectronic components, for example light-emitting diodes (LEDs, Light-Emitting Devices), are used in various technical applications. In particular, LEDs are being used increasingly for lighting purposes. Depending on the respective application, different LEDs having defined light characteristics may be produced. As a result of production, however, more or less pronounced variations in the light characteristics occur in LEDs of the same component range. While a certain variance of the light properties is unproblematic for some fields of use of LEDs, maximally accurate knowledge of the light characteristics of the LEDs used is a prerequisite for particular special applications. Thus, the LED light perceived by the human eye is in general already characterized sufficiently by means of few macroscopic data, for example photometric brightness and color locus. For applications which record LED light in particular by a sensor, it is advantageous to have maximally accurate knowledge of the characteristics of individual LEDs. For LED light which is recorded by a sensor, besides the macroscopic data such as radiometric brightness, in particular the light power spectrum, which has a much larger data volume, is thus of interest. An example which may be mentioned here is a cell phone, the camera module of which records the light of an internal LED flash.

For LED components having a plurality of individually controllable colors (LED chips), there is a correspondingly enlarged data volume. Storage of these data in the memory modules integrated in the LED component therefore requires a relatively large memory volume, which inter alia is associated with relatively high production costs. Since the size of the corresponding memory modules also increases with the storage capacity, large memory volumes are relatively critical precisely in application fields having a significantly restricted installation space.

The methods to date for the characterization of LED components comprise, inter alia, so-called binning. In this case, the LED components are divided into so-called bins, each bin being assigned a parameter range. In the case of a relatively fine distribution, some parameters, for example brightness and color, can be characterized correspondingly accurately for each LED component by means of binning. Spectral information, however, cannot be handled meaningfully by binning because of the amount of data.

For the characterization of individual LED components, it is furthermore possible to use so-called data files, the LEDs being for example already measured at the chip level (wafer maps) and provided with unique codes (for example laser codes). The data must in this case be communicated to the user offline, for example in the form of data files which allow assignment of the data with the aid of the unique code of the LED components.

If the power spectra are stored in the memory modules of the LED components, the need arises to use correspondingly large and therefore expensive memory modules. Otherwise, only few data for characterization of the LED component can be stored.

SUMMARY OF THE INVENTION

Embodiments of the invention provide a possibility of storing spectral data of an optoelectronic component with an information content that is as high as possible in memory devices of the optoelectronic component, which only have a restricted storage capacity. According to the method for compressing power spectra of optoelectronic components, at least one power spectrum of an optoelectronic component is provided and is sampled at particular sampling wavelengths in order to produce a discrete source spectrum. The discrete source spectrum is subsequently indexed in order to produce a source graph having discrete source values, the wavelengths being replaced by continuous indices. An image graph having discrete image values is subsequently produced by transforming the source graph from a source range into an image range with the aid of a discrete frequency transform. Compression of the image graph is subsequently carried out, relevant and low-relevance components of the image graph being identified and the low-relevance components being eliminated from the image graph. Lastly, the compressed image graph is digitized in order to produce compressed spectral data, each image value of the compressed image graph being assigned a corresponding digital number having a determined bit depth. With the aid of this compression method, the amount of data, intended to be stored, of one or more power spectra can be reduced significantly. Power spectra having a relatively high information content can therefore be stored even in memory modules having a relatively small memory volume. The use of small memory modules allows small installation sizes of the associated optoelectronic components. Furthermore, the production costs can be kept low by the use of memory devices having a low storage capacity.

According to one advantageous embodiment, the transformation of the source graph is carried out with the aid of a discrete cosine transform. With the aid of the discrete cosine transform, it is relatively straightforwardly possible to separate important signal components from unimportant signal components. When using real numbers, with the aid of the discrete cosine transform, compared with comparable transforms, for example the discrete Fourier transform, it is possible to avoid elaborate calculation with complex numbers. The computation outlay for coding and decoding the power spectra can thereby be reduced.

According to another advantageous embodiment, cascading of the discrete frequency transform is carried out by storing image values having low indices of an image graph produced by means of the discrete frequency transform and re-transforming the remaining image values of the image graph with the aid of the discrete frequency transform. Such concatenation of transforms allows successive concentration of relevant signal components to low indices without substantial losses of the overall information. This is advantageous above all in the case of spectral values having relevant and, in particular, systematically high frequency components.

According to another embodiment, image values having an index above a threshold value index are eliminated during the compression of the image graph, the threshold value index being predetermined in a fixed manner or being dynamically determined. Filtering by means of a threshold value index represents a particularly simple and at the same time very effective compression method. By simple shifting of the threshold value index on the corresponding index scale, the compression method can be optimized very straightforwardly in respect of the degree of compression and the size of the compressed spectral data.

According to another embodiment, spectral values of the power spectrum are multiplied by a first scaling factor before the sampling. In this case, a value which is constant over the entire wavelength range or a function dependent on the wavelength is used as the first scaling factor, the first scaling factor being established for a plurality of power spectra or being dynamically determined as a function of the respective power spectrum. Values of the power spectrum may be adapted with the aid of this scaling step. In particular, a plurality of power spectra can be matched to one another on the power scale with the aid of the scaling. The use of a function as a scaling factor allows optimized scaling, while the use of fixed values as a scaling factor allows particularly straightforward scaling. The use of scaling factors established in advance is recommendable in particular when the power spectra of different optoelectronic components differ only insubstantially from one another. In this case, the decoder can operate with the aid of a table so that the scaling factor, or the corresponding parameters of the scaling factor, do not need to be communicated to the decoder with the coded spectral data. On the other hand, dynamic determination of the scaling factor offers optimization of the scaling for each individual optoelectronic component.

According to another embodiment, the image values are scaled with the aid of a second scaling factor after the compression of the image graph, a predetermined or dynamically determined constant value or a predetermined or dynamically determined function being used as the second scaling factor. With the aid of the scaling of the transformed and compressed image graphs, the image values can be optimized for the digitizing. In this way, with expedient selection of the scaling factor, all of the values of the compressed image graph can be brought for example into a range between −1 and +1, which allows particularly straightforward digitizing.

According to another embodiment, an envelope of the compressed image graph is determined for the scaling, and the image values of the compressed image graph are divided by corresponding values of the envelope. By determining a suitable envelope, scaling of the compressed image graph to values between −1 and +1 can be achieved particularly straightforwardly.

According to another embodiment, a logarithm of the absolute values of the image values of the compressed image graph is formed for the scaling, a regression line being determined with the aid of a linear regression for image values having an index less than or equal to the threshold value index. An envelope of the compressed image graph is subsequently determined by linear displacement of the regression line. Lastly, the image values of the compressed image graph are divided by corresponding values of the envelope. With the aid of this concept, a suitable envelope can be determined in a particularly straightforward way and optimal scaling of the compressed image graph can therefore be achieved.

According to another embodiment, sampling wavelengths which are predetermined in a fixed manner or are dynamically determined are used for the sampling, the sampling being carried out with the aid of a sampling wavelength resolution which is constant or dependent on the information content of the sampling points. In this case, the use of predetermined sampling wavelengths allows direct comparison of different power spectra. On the other hand, by dynamic determination of the sampling wavelengths, the sampling and therefore the entire coding process can be optimized. Furthermore, the information content of the individual sampling points of the respective application can be optimized by variation of the sampling wavelength resolution.

According to another embodiment, negative values of the power spectrum are set to zero before the sampling. In this way, the dynamic range of the power spectrum to be compressed can be reduced without information loss.

According to another embodiment, in order to produce the discrete source graph, at least two different power spectra of the optoelectronic component are combined to form an overall power spectrum and are indexed together. In this case, the individual power spectra are joined to one another directly or are separated from one another by means of spacer values inserted before, between and/or after the individual power spectra. Lastly, the individual power spectra are scaled separately or together. By compressing a plurality of individual power spectra of an optoelectronic component, the amount of data can be reduced significantly in comparison with separate compression of the individual power spectra. In this way, by using spacer values, on the one hand adaptation of the various power spectra can be achieved. At the same time, the insertion of spacer values allows minimization of the distortion caused by the compression process in the outer ranges of the individual spectra. By separate scaling of the power spectra, the individual spectra can be scaled particularly optimally. On the other hand, the amount of data can be reduced by common scaling.

According to another embodiment, the digitizing of the compressed image graph is carried out with a constant or dynamically determined bit depth. In this case, the constant bit depth allows particularly straightforward digitizing. On the other hand, with the aid of the dynamically determined bit depth, weighting of the various frequency components in respect of the maximum quantization errors can be achieved. For example, frequency components having a low index may be imaged as accurately as possible with a high bit depth, while frequency components having a higher index may be imaged with a lower depth, and therefore a larger quantization error.

According to another embodiment, an estimate of the amount of data and/or the compression quality of the compressed spectral data produced by the compression method is carried out. In this case, particular parameters of individual or multiple method steps are adapted with a view to an optimal amount of data and/or compression quality of the compressed spectral data and the corresponding method steps, or the compression method, are carried out again with the adapted parameters. By this estimation, which may be carried out both after individual method steps and after having carried out the compression algorithm fully, it is possible to ensure that the amount of data of the compressed spectral data does not exceed the predetermined memory size. At the same time, it is therefore possible to ensure that a power spectrum reconstructed with the aid of the compressed spectral data matches as well as possible with the original power spectrum.

In the decoding method for decompressing a power spectrum compressed by a compression method according to the invention, the compressed spectral data of the power spectrum are initially provided and reversal of the digitizing is carried out, each digital number of the compressed spectral data respectively being assigned an image value corresponding to the respective bit depth. Reverse scaling is subsequently carried out, the image values being divided by the second scaling factor. Furthermore, indexing of the image values is carried out in order to produce a reconstructed image graph, each image value being assigned a corresponding image index. Subsequently, a transform which is the inverse of the discrete frequency transform used by the coder is applied to the reconstructed image graph in order to produce a reconstructed source graph. Subsequently, reversal of the indexing is carried out in order to produce a reconstructed source spectrum, the individual source indices of the reconstructed source graph being assigned corresponding wavelengths. Lastly, further reverse scaling of the reconstructed source spectrum is carried out in order to produce a reconstructed power spectrum. With the aid of the decoding method, which is essentially carried out in the reverse order to the compression method, it is possible to produce production of a reconstructed power spectrum with relatively small differences from the original power spectrum. To this end, the decoding device uses those parameters which were used by the coding device for coding the compressed spectral data.

According to one embodiment, the image values of the reconstructed image graph are interpolated in order to produce additional image values. In this case, with the aid of the additional image values, desired intermediate values in the reconstructed power spectrum are produced by applying the inverse transform, reversing the indexing, and reverse scaling. In this way, it is relatively straightforwardly possible to produce particular spectral values, which were not present in the original discrete power spectrum, in the reconstructed power spectrum.

BRIEF DESCRIPTION OF THE DRAWINGS

The properties, features and advantages of this invention as described above, and the way in which they are achieved, will become more clearly and readily comprehensible in conjunction with the following description of the exemplary embodiments, which will be explained in more detail in conjunction with the drawings. In schematized representations:

FIG. 10 shows by way of example a data set of compressed spectral data in the form of a table;

DETAILED DESCRIPTION OF ILLUSTRATIVE EMBODIMENTS

The storage of power spectra of an optoelectronic component is subjected to particular restrictions because of the high data volume of such power spectra. For the storage of a power spectrum of a light-emitting diode, only a very restricted memory volume is available because of the small size of the light-emitting diode. In order to permit maximally accurate reconstruction of the power spectrum from the data stored in the memory device, suitable data compression should be used for compressing the power spectrum. The coded power spectrum is then preferably written into the memory device of the light-emitting diode still during the context of the production method of the light-emitting diode.

The coding method described below uses a lossy compression method in which data are separated into an important part and an unimportant part for the application and only the important part is stored. A typical unimportant part is, for example, the noise. The boundary between the important and unimportant parts is in this case generally fluid. By adapting this boundary, which is done in the exemplary embodiment described above by shifting the threshold value index along the image index scale, it is therefore possible to control the data size of the compressed data exactly. This form of compression is therefore particularly well suited for optimization of the data size with respect to a limited memory volume. The shape of the input signal, the quality of the coder and the available data volume, in this case determine the quality of the compression, i.e. the extent to which the decoded coded data match with the original data.

Figure 1:
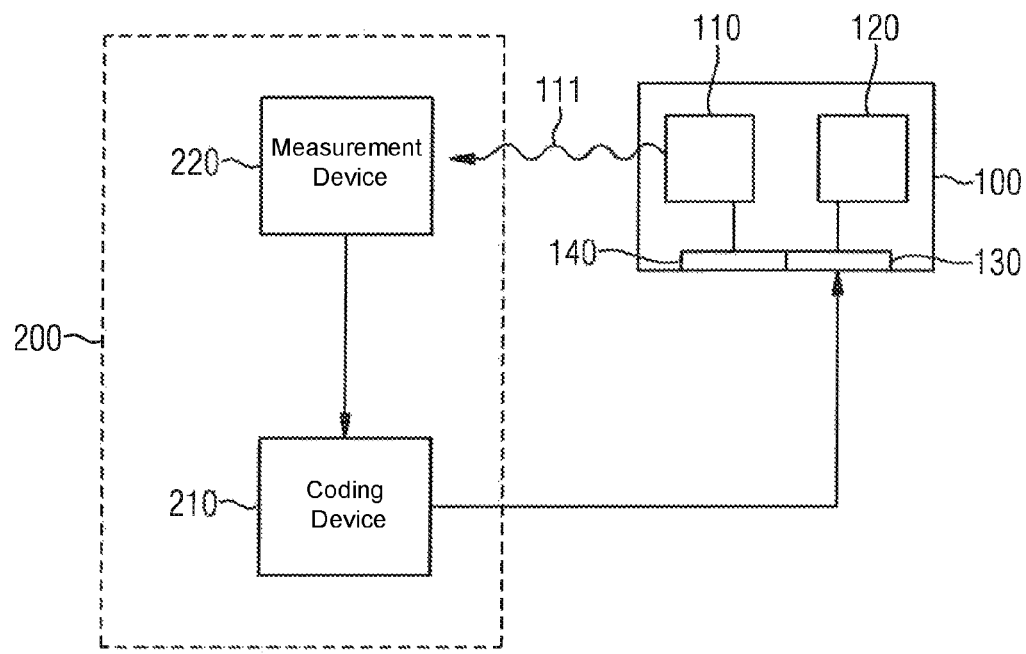
FIG. 1 shows an exemplary arrangement for measuring and coding a power spectrum of an optoelectronic component with the aid of a measurement and coding device.
Figure 2:
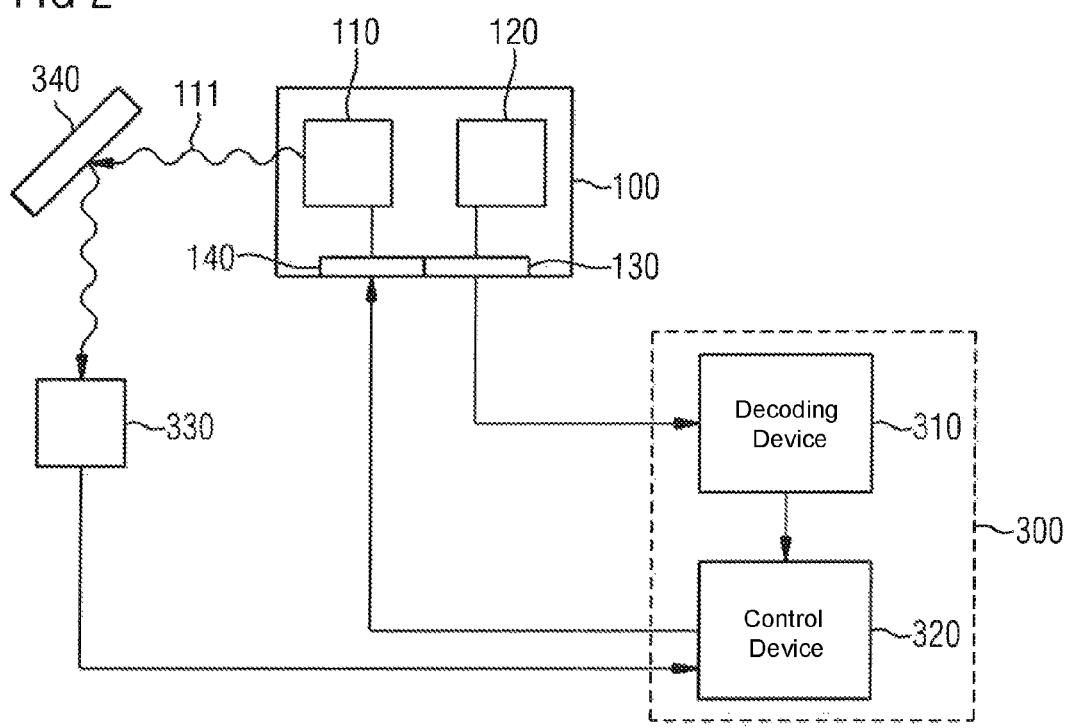
FIG. 2 shows a schematic representation of an arrangement for operating an optoelectronic component with a decoding apparatus for decoding the compressed power spectrum of the respective optoelectronic component.

One possible arrangement for coding the power spectra is shown in FIG. 1. In this case, light 111 emitted by an optoelectronic semiconductor module no of an optoelectronic component 100 is received by a measurement device 220. The measurement device 220, typically configured in the form of a spectrometer, determines the power spectrum of the incident light and forwards this power spectrum of data to a coding device 210. The coding device 210, also referred to as a coder, produces a set of coded spectral data from the received power spectrum with the aid of a special algorithm. The compressed spectral data are subsequently transmitted via a corresponding data interface 130 to the electro-optical component 100, and are stored there in an internal memory device 120. Although the measurement device 220 as well as the coding device 210 are combined as a common measurement and coding apparatus 200 in the schematic representation of FIG. 1, the measurement process and the coding process may be carried out independently of one another both in terms of time and spatially. The storage of the coded spectral data in the memory device 120 may also be carried out before the memory device 120 is mounted on the optoelectronic component 100. The reconstruction of the power spectrum from the compressed spectral data is preferably carried out with the aid of a suitable decoding device, such as is shown for example in FIG. 2. The compressed spectral data read out from the memory device 120 of the optoelectronic component 100 are in this case converted into a reconstructed power spectrum in the decoding device 310, also referred to as a decoder, essentially by a reversal of the method steps carried out by the coding device 210. Depending on the application, the reconstructed power spectrum may be used directly or stored in a memory for later use. In the present exemplary embodiment, the reconstructed power spectrum is sent to a control device 320, which carries out control of the optoelectronic semiconductor chip 110 of the optoelectronic component 100 with this information. As an alternative or in addition thereto, the control device 320 may be used the reconstructed power spectrum of the optoelectronic semiconductor chip 110 for controlling or evaluating an optical sensor 330, which receives the light 111 of the optoelectronic semiconductor chip 110 which has been reflected by an object 340. This sensor device 330 may for example be a camera module of a cell phone, in which case the optoelectronic semiconductor chip 110 is configured in the form of a flash or photographic light. In such a case, the control device 320 may carry out a correction of the images received by the camera module 330 with the aid of the power spectrum of the light source 110 read out from the memory device 120 and reconstructed by the decoding device 310. Although FIG. 2 shows the decoding device 310 and the control device 320 in the form of a common decoding and control apparatus 300, the decoding of the coded spectral data and the use of the decoded spectral data, for example for processing a sensor signal, may be separated from one another both in terms of time and spatially. For instance, the coded spectral data may already be decoded in advance and stored in a memory of the respective application for later use.

The coding and decoding devices 210, 310 shown here may in principle be produced in the form of hardware, software or a combination of hardware and software.

Figure 3:
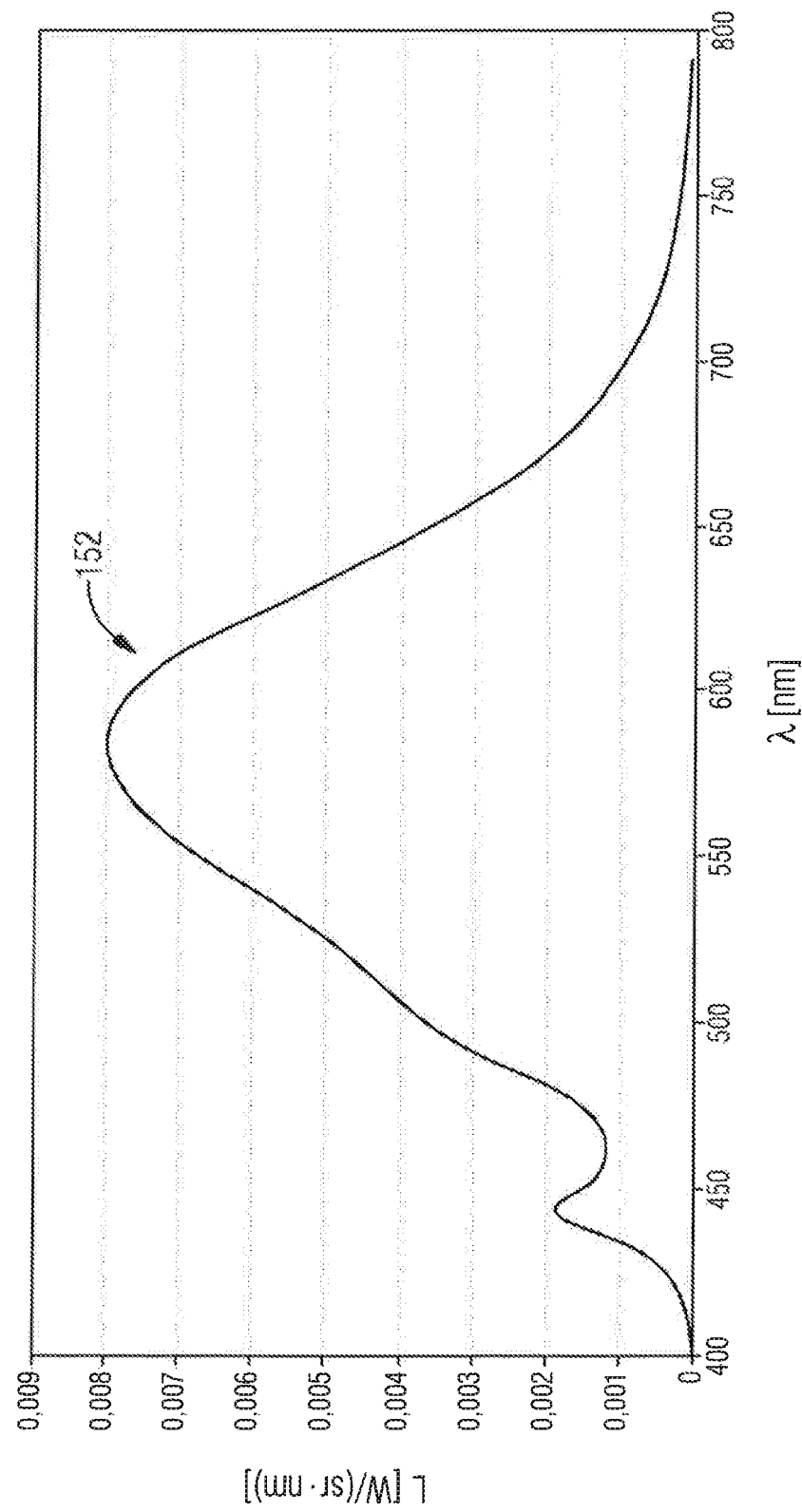
FIG. 3 shows by way of example a power spectrum of a light-emitting diode.

Both the coding and decoding processes according to the invention will be represented in detail below with the aid of an exemplary power spectrum and various associated graphs. To this end, FIG. 3 shows a typical light power spectrum of a green LED, as is obtained after a corresponding measurement by means of a spectrometer of the coding device 210. More precisely, this is a power density spectrum in which typically the radiance L is plotted against the wavelength λ, the radiance L meaning the radiation flux or the radiation power per unit solid angle per unit area expressed in watts per square meter per steradian [W sr-1 m-2]. The power spectrum 152 is in this case typically available with a relatively high wavelength resolution, so that the uncompressed spectral data have a large data volume.

Figure 4:
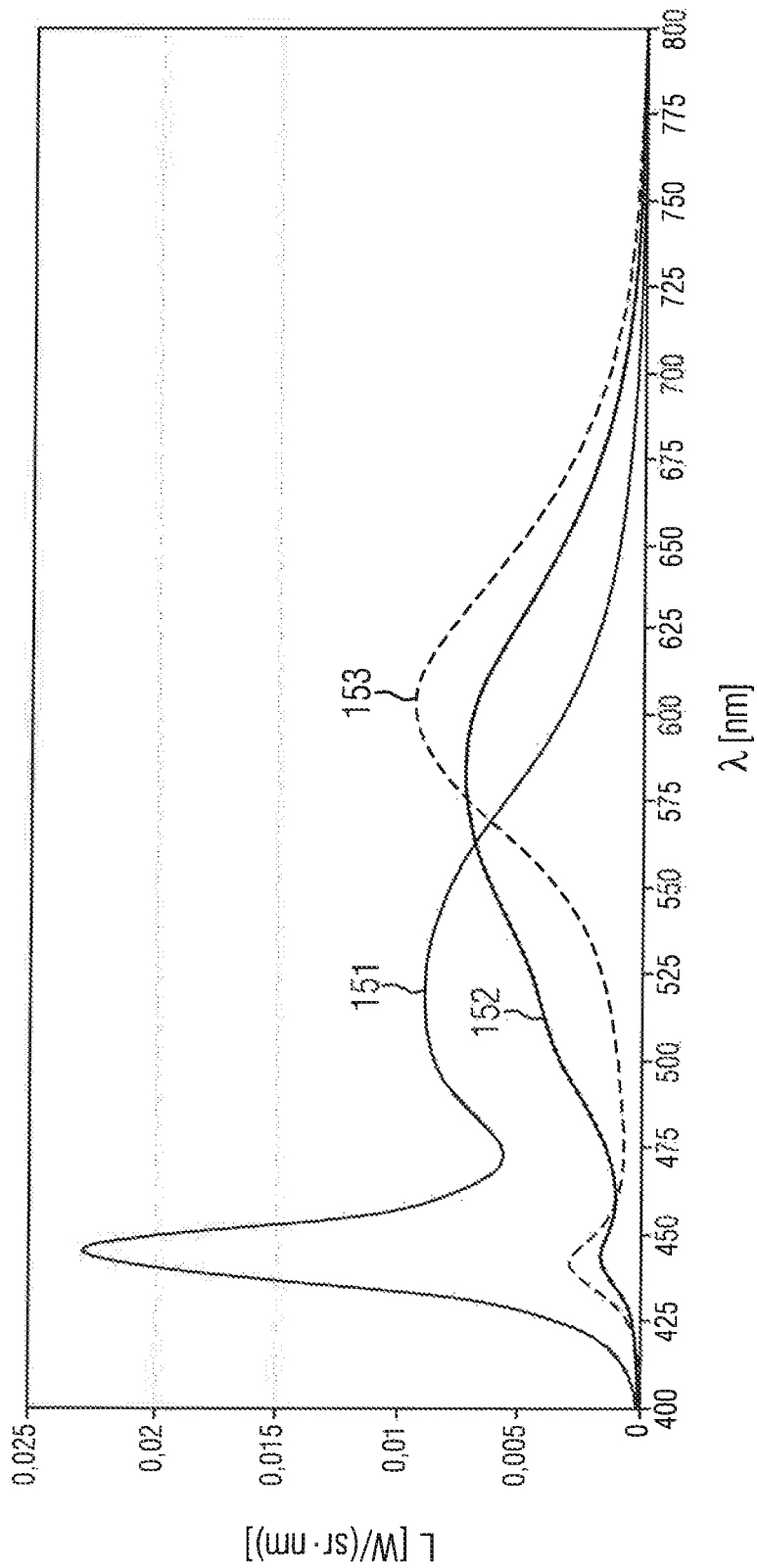
FIG. 4 shows three different power spectra of a multicolored light-emitting diode.

In the case of multicolored LEDs, this data volume increases significantly since the power spectra of the individual LED chips are used for the characterization of such LEDs. FIG. 4 shows by way of example three power spectra 151, 152, 153 of a multicolored light-emitting diode. The individual power spectra 151, 152, 153 differ from one another in this case significantly in terms of level, which on the one hand is due to production but on the other hand is related to the physiological perception of light by the human eye.

A reduction of the amount of data needed in order to describe these power spectra may, however, be achieved by suitable compression of the power spectra 151, 152, 153. In a first step, negative values of the power spectra 151, 152, 153 may initially be eliminated. Such negative values generally occur because of noise effects and because of particular processing operations in the spectrometer 220. To this end, spectral values which are less than zero may be set equal to zero. This method step is in principle optional.

In a second method step, which is likewise optional, scaling of the individual power spectra 151, 152, 153 may be carried out. This is expedient, for example, when the spectral values within the individual power spectra vary over a relatively wide range or when the spectral values of different power spectra have different orders of magnitude. By the scaling, normalization or adaptation of the power spectra can be carried out, so that the spectral values of the individual power spectra have orders of magnitude which are favorable for the subsequent digitizing. Depending on the application, the scaling factor within a spectrum may be constant. Furthermore, a function, for example a function of the wavelength, may be used for the scaling. The coding device 210 may be provided with a fixed scaling factor which is used for all the power spectra, or a dynamically determined scaling factor may respectively be used, which is selected or specially produced as a function of the respective power spectrum. In the latter case, however, the scaling factor needs to be communicated to the decoding device. This is typically done by inserting corresponding parameters of the scaling function into the data set which has been compressed, although this is associated with a high memory requirement.

The power spectra provided by the spectrometer 220 are typically available in a relatively high wavelength resolution over a wide wavelength range. Since only a restricted wavelength range is usually needed for the application, and the wavelengths provided by the spectrometer may possibly not correspond to the wavelengths required by the application, sampling of the power spectra 151, 152, 153 at particular wavelengths is carried out in the coding device 210. These sampling wavelengths may be constant, i.e. specified by a table and applicable for all equivalent power spectra. As an alternative, the sampling wavelengths may also be determined dynamically in the coding device 210, e.g. with the aid of a particular function. In this case, the sampling wavelengths or the parameters of the respective function must be communicated to the decoding device 310, which is typically associated with a relatively higher data volume. The coding device 210 may use a constant wavelength resolution for the sampling, the sampling wavelengths respectively being equidistant from one another. As an alternative to this, the sampling wavelengths may also be selected nonlinearly, so that the individual sampling points have different distances from one another. Advantageously, the sampling wavelengths may in this case be selected in such a way that, as a result of the sampling, the information content of each sampling point is as far as possible equivalent or the information content is optimized according to the application. In the latter case, wavelength ranges which are important for the respective application are sampled with a high sampling rate, while less relevant wavelength ranges are sampled with a low sampling rate. The sampling wavelengths may, for example, be adapted to the LED spectra to be expected. Thus, the coder may be optimized for expected spectra, with the risk that the coding quality decreases for unexpected spectra. By an expedient selection of the sampling wavelengths, the coder may also be configured relatively robustly so that it functions equally well for a wide range of LED power spectra.

If the original spectrum is available in discrete form, which is typically the case with digital spectrometers, the sampling may advantageously be carried out with an interpollation routine. For this, the lever rule, linear regression, or a polynomial fit may for example be envisaged.

By an expedient selection of the number of sampling wavelengths, the ratio between computation outlay and coding quality can be determined and optimized. In this case, the coding quality generally increases with a higher sampling resolution. However, a sampling resolution lying above the resolution of the original spectrum does not provide any further performance advantage.

If a discrete power spectrum provided by the spectrometer systematically contains nonrelevant signal components, for example systematic predominantly high components in the noise signal caused by spectrometer sampling and digitizing, these may be broken down by resampling in such a way that they are effectively suppressed or removed by the subsequent algorithm.

In order to compress the power spectra, the spectral values are indexed. In this case, the spectral values are arranged in their order and are provided with a continuous source index $I_A$ (0, 1, 2 . . . max_index). Each source index $I_A$ in this case corresponds to a particular sampling wavelength. If an optoelectronic component has a plurality of light-emitting diodes, the individual LED spectra may be indexed individually and subsequently coded separately. It is, however, advantageous to combine a plurality of individual power spectra 151, 152, 153 to form an extended power spectrum 154. The individual power spectra 151, 152, 153 may then be indexed and subsequently coded together. In order to optimize the power spectra 151, 152, 153 for the subsequent transformation, it is expedient to introduce particular spacer values at the start and end of each individual spectrum 151, 152, 153, and in the transition region between two individual spectra 151, 152, 153. The effect which can be achieved in this way is that errors that occur as a result of the subsequent transformation, preferably in the edge regions of the spectra, are concentrated only on the spacer values while the actual spectra remain substantially protected from these errors. Furthermore, a better transition between the two spectra can be achieved with the aid of suitable spacer values.

Figure 5:
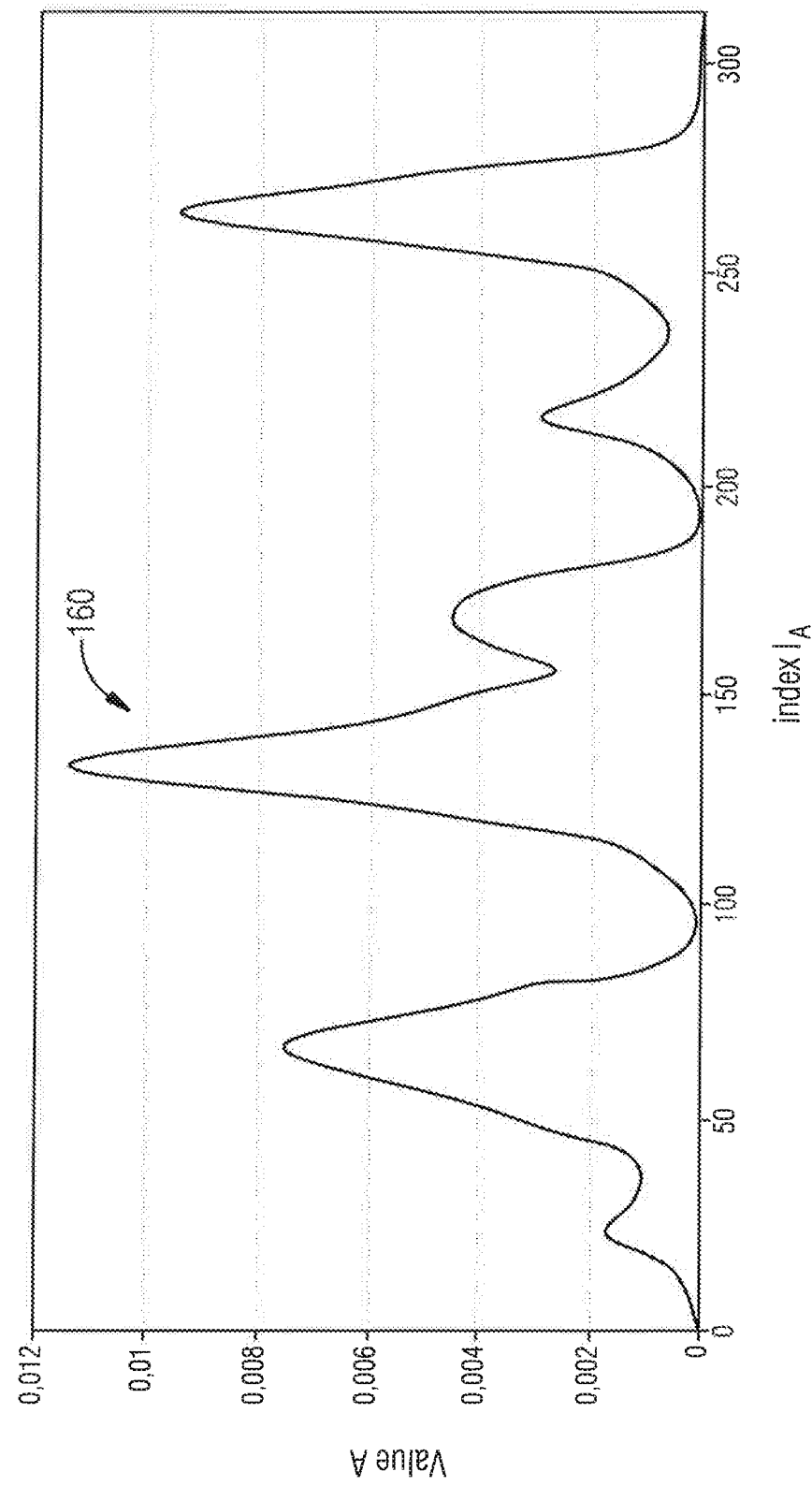
FIG. 5 shows a source graph composed of the three power spectra and produced by scaling and indexing.

FIG. 5 shows by way of example a source graph 160 formed by scaling, sampling, combination and indexing from the three power spectra 151, 152, 153 shown in FIG. 4. Since the subsequent mathematical algorithms use dimensionless numbers, the physical quantities of wavelength λ in nm and radiance L in (W/(sr nm2)) have been replaced in the source graph 160 by the dimensionless source index $I_A$ and the likewise dimensionless source value A.

In the subsequent method step, a transformation of the source graph 160, provided here as a discrete spatial signal, is carried out from a position or source range into a frequency or image range. This may in principle be done by any suitable discrete linear orthogonal transform. Preferably, however, the discrete cosine transform (DCT) is used for this. More precisely, one of the four known variants I, II, III, IV of the discrete cosine transform is used. The normalization typically needed in the case of discrete transforms for conservation of power may be carried out in various ways. For instance, the normalization factor 1/(max_index+1) may not be applied during the coding, so that it then needs to be applied by the decoder. The normalization factor may furthermore be used as a root by the decoder, in which case the decoder must also apply the normalization factor as a root. Lastly, the normalization factor may be applied fully by the coder, so that it does not need to be applied by the decoder.

Figure 6:
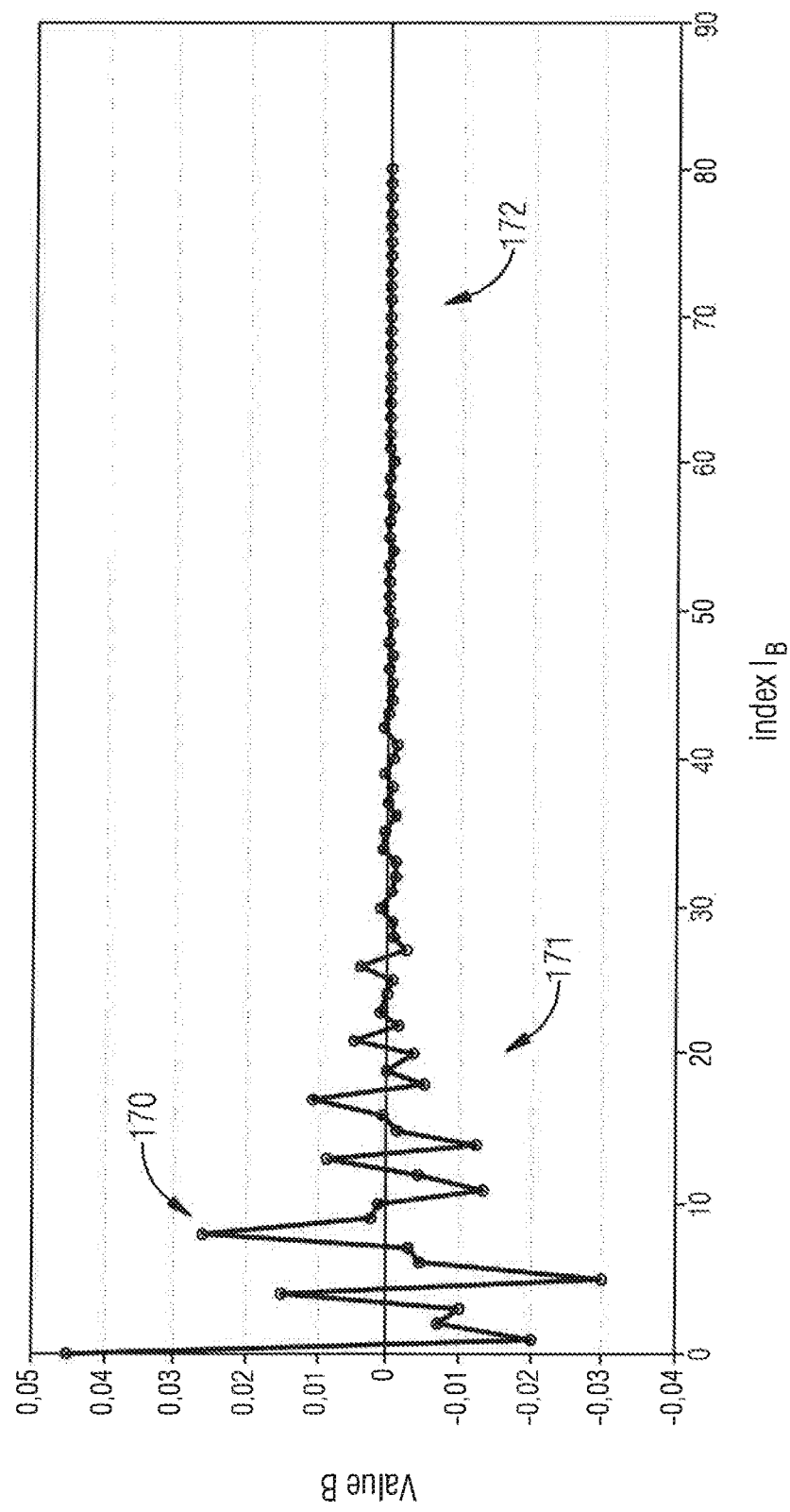
FIG. 6 shows an image graph produced by discrete frequency transform of the source graph.

The discrete cosine transform concentrates important (low-frequency) signal components onto the low indices and unimportant (high-frequency) signal components, for example the noise, onto the high indices. Since LED power spectra have no discontinuities, for example kinks or jumps, their relevant signal components are typically low-frequency. The high-frequency signal components are, on the other hand, more dominated by noise. For this reason, with the aid of a suitable discrete transform, and in particular with the aid of the discrete cosine transform, good separation is achieved between relevant and nonrelevant signal components. In this context, FIG. 6 shows the frequency spectrum 170 of the discrete Fourier transform of the source graph 160. In the frequency spectrum referred to below as an image graph 170, the indices $I_B$ forming the abscissa axis, which are referred to below as image indices, correspond to individual functions of the discrete cosine transform, and the frequency values plotted along the ordinate axis, which are referred to as image values B in order to distinguish them from the source values A of the source graph 160, correspond to the respective coefficients of the individual functions. The frequency components of the image graph 170 show in the low-frequency range an exponential decrease typical of signals with uncorrected frequency components, with high values in the near region and low values in the far region of the frequency spectrum. When carrying out the transformation, it is therefore possible to restrict the calculation to a suitable near index region. In this way, the computation outlay can be reduced.

Since, the discrete cosine transform allows calculation with real numbers, in contrast to the discrete Fourier transform, elaborate calculation with complex numbers can be avoided. It is, however, also possible in principle to use other equivalent transforms, for example discrete sine transform, discrete Fourier transform or fast Fourier transform, as an alternative to the discrete cosine transform.

If necessary or expedient, cascading of the transform may also be carried out. This involves concatenation of transforms, in which after a transform has been carried out, index values o . . . n are stored and the further index values n+1 . . . m≤max_index are transformed again by means of the discrete cosine transform. This step may be repeated several times, in the limiting case respectively only the lowest index value being kept and all other index values being transformed again. This method leads to a significantly increased computation outlay, since calculation is carried out with a larger index range. With the aid of this cascading, however, in the case of spectral values having relevant and in particular systematic high frequency components, successive concentration of these relevant signal components onto the low indices is achieved. The data volume of the coded spectral data can therefore be reduced significantly, specifically without the reproducibility of the power spectra being substantially impaired at the same time.

In order to reduce significantly the amount of data of the coded power spectrum or spectra, it is expedient to identify relevant and low-relevance signal components and to eliminate the low-relevance signal components from the frequency spectrum. This is done by means of a subsequent compression step, a threshold value index S being determined and index values above the threshold value index S being removed from the frequency spectrum. By a suitable selection of the threshold value index S, on the one hand the ratio of the amount of data to the compression quality can be optimized. In particular, the compression can thereby be configured in a particularly straightforward way to a predetermined memory volume. On the other hand, with a suitable selection of the threshold value index, smoothing of the spectral curve is achieved.

In the case of typical LED spectra, an index in the range of from ¼ to ⅕ of the maximum index may be selected as a threshold value index S. It is expedient the threshold value index S lie at the index boundary between the informative signal, which typically decreases exponentially, and noise, which typically has a more constant profile. Depending on the application, the threshold value index S may be predetermined or dynamically determined in the coding device 210. In the latter case, however, the threshold value index S needs to be communicated to the decoder and therefore occupies additional memory space.

Figure 7:
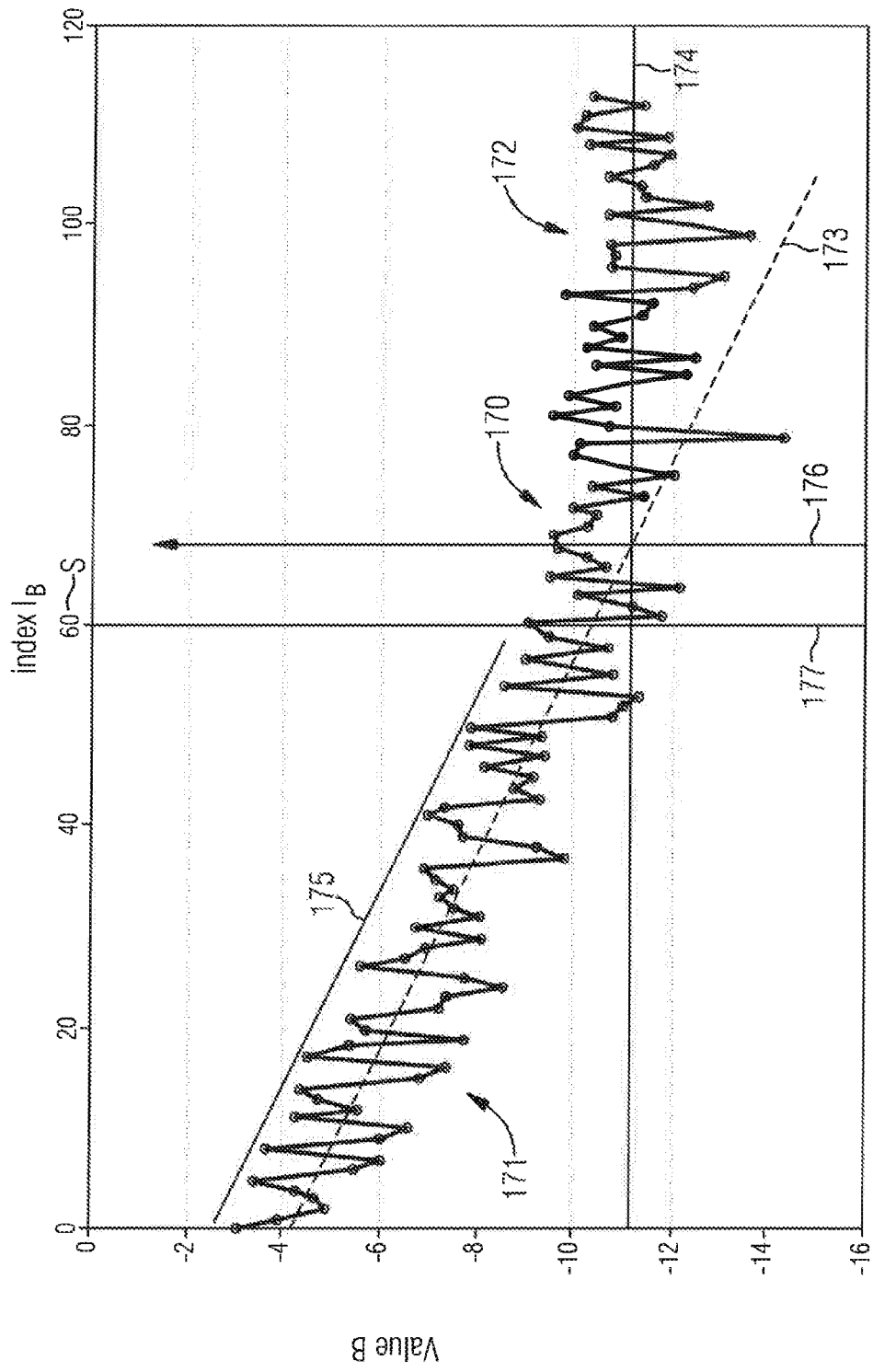
FIG. 7 shows a logarithmic representation of the absolute values of the image graph of FIG. 6 with corresponding regression lines, envelopes and the threshold value index.

FIG. 7 shows the absolute values of the source graph 170 plotted on a logarithmic ordinate. Because of the exponential decrease of the relevant signal components, in this illustration there is an essentially straight curve profile up to an image index $I_B$ of about 65, there being a horizontal curve profile essentially caused by the broadband-distributed noise signals for the values above this limiting index. The limiting index 176 in this case lies at the intersection of a first regression line 173 of a first graph section 171 having image indices $I_B$ less than the total index 176 and a second regression line 174 of a second graph section 172 having image indices $I_B$ greater than the limiting index 176. As shown by FIG. 7, the threshold value index S preferably lies in the region of the limit value index defined by the straight line 176, although the position of the threshold value index S may vary along the index axis around the limit value index depending on the desired compression and signal quality.

In order to optimize the digitizing of the image values B, scaling of the compressed image graph 170 may be carried out following the compression step. During the scaling, the image values B are multiplied by a scaling factor. This may, for example, be done with a scaling factor predetermined in a fixed manner. As an alternative thereto, the scaling factor may be dynamically determined, or established, by the coder, for example as a function of the image index $I_B$. In this case, however, the scaling factor must be communicated to the decoder, which increases the amount of data in the coded data set.

The scaling is preferably carried out with the aid of an envelope, an envelope method in which the absolute values of the image values B are initially formed and a logarithm of the absolute values is subsequently formed being suitable because of the exponential decrease of the image values B of the compressed image graph 170. The natural logarithm is suitable in particular for this since the frequency components are uncorrelated and therefore decrease exponentially. In the image index range of from o to the threshold value index S, linear regression is carried out which gives the two parameters X_scale (index axis) and Y_scale (frequency value axis), with the aid of which a regression line can be produced. The parameters X_scale and Y_scale may in this case indicate the intersections of the regression line with the image index axis and the image value axis. As an alternative thereto, X_scale may also indicate a gradient of the regression lines. By difference determination between the regression line and the logarithmic values in the image index range of from o to the threshold value index S, the regression line is shifted by modification of a parameter X_scale or Y_scale, in such a way that all the logarithmic values always lie below the shifted regression line. Optionally, a safety margin of for example 5% may be introduced. The regression line shifted in this way forms a straight envelope line the modified parameter X_scale and the associated parameter Y_scale are respectively scaled with an established scaling function having fixed parameters and rounded to an integer. These values are likewise inserted into the compressed data set and are thus transferred to the decoder.

Figure 8:
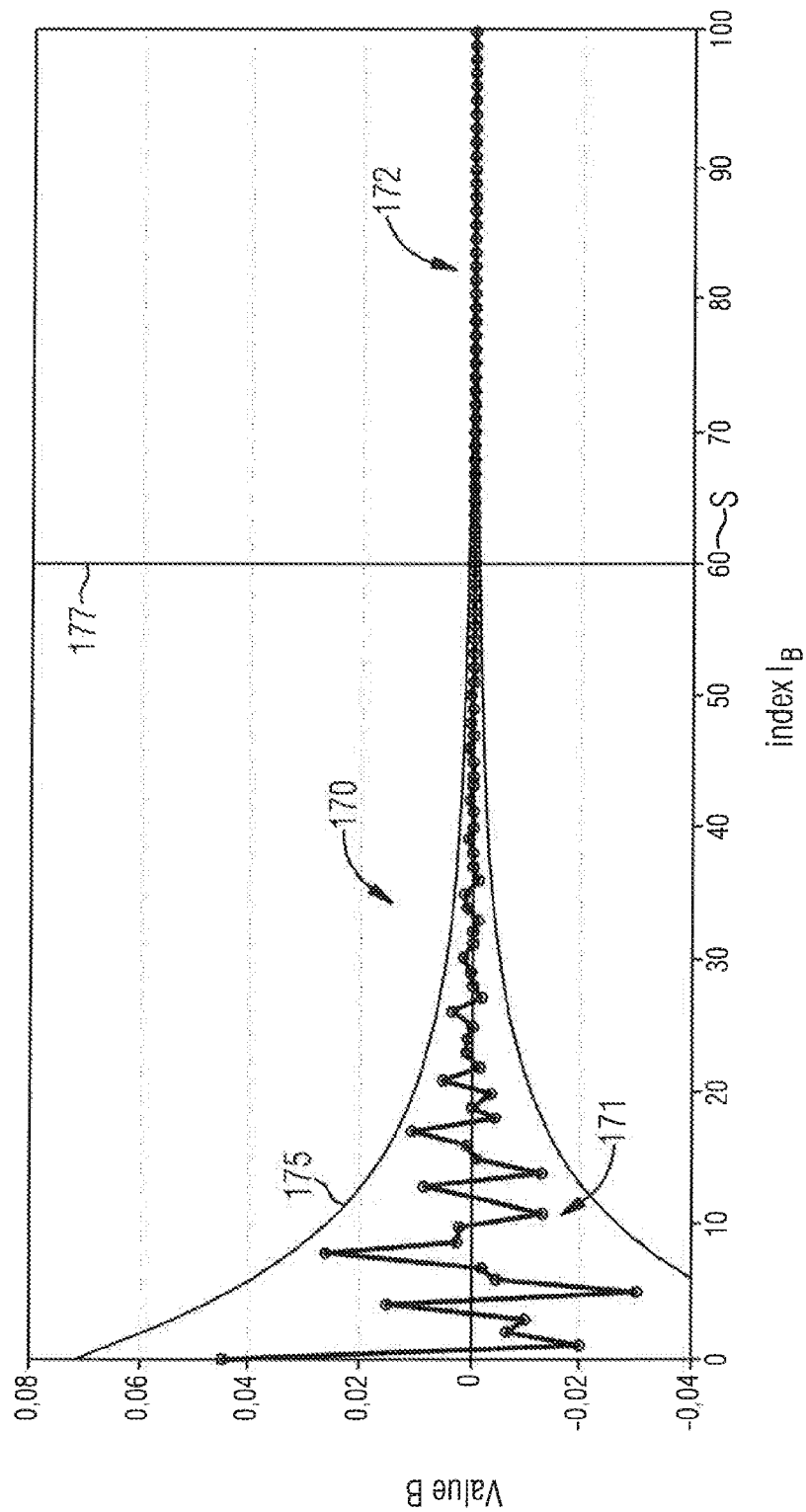
FIG. 8 shows the image graph after reversal of the logarithmic representation with an exponentially decreasing envelope.

With the modified parameters X_scale and Y_scale, the rounded values respectively being used, an envelope 175 which contains all image values B of the image graph 170 in its first section 171 is produced. As presented in FIG. 8, the envelope 175 exhibits an exponential profile. For clarification, the envelope 175 is also indicated in the negative range in FIG. 8.

Figure 9:
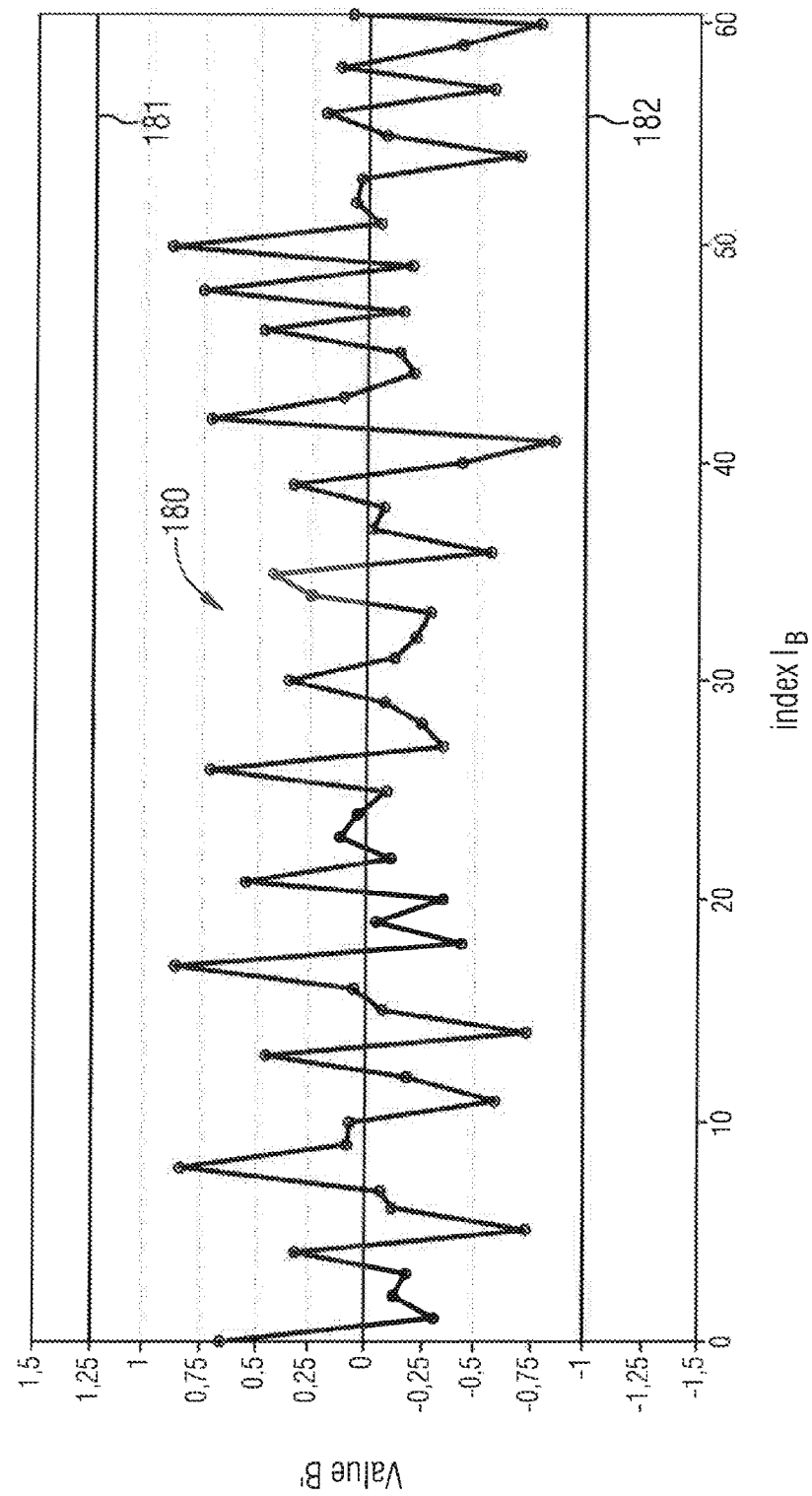
FIG. 9 shows the image graph of FIG. 8 after scaling with a second scaling factor.

In order to scale the image graph 170, the image values B of the image graph 170 in the image index range of from o to the threshold value index S are now divided by the corresponding envelope values of the envelope 175. As represented in FIG. 9, this therefore gives scaled image values C which lie between −1 and +1. The available bit depth of the subsequent digitizing step is therefore utilized optimally. Furthermore, a possible overflow is reliably avoided by the scaling.

With the aid of the parameter X_scale, the coder can estimate its performance, or generate a warning or error message when the estimate gives a limit-value performance or insufficient performance. By the logarithmic scaling of the parameter Y_scale, a large power range of the spectral values can be covered.

In the subsequent digitizing step, each image value B or B' is assigned a digital number having a defined bit depth. In this case, bit depth assignment predetermined for example with the aid of a table may be used, or as an alternative thereto the bit depth may be assigned dynamically by the coder with the aid of a function. This assignment may for example be formed in its own bit depth envelope function and communicated in the form of function parameters to the decoder. In this case, additional memory space is required for the function parameters.

If the image values B or B' lie between −1 and 1, the following simple assignment may be used: digital value: equal to image value times $(2^{(bit\ depth-1)}-1)$ The definition of the threshold value index S, which determines the number of coded frequency values, defines together with the bit depth the required memory space of the compressed spectral data. By tuning these factors, in the case of a lack of memory space, the size of the compressed data set can be reduced relatively straightforwardly. On the other hand, the compression and digitizing generates a data loss which leads to a difference of the decoded coded spectrum (i.e. the reconstructed spectrum) from the original spectrum. By accurate tuning between compression and digitizing, with a predetermined memory space, the coding quality can be optimized.

FIG. 10 shows by way of example a possible compressed data set in a tabular form. The digital numbers (data string) and the associated bit depth are respectively represented. As can respectively be seen, the compressed data set is composed of a first part I, in which parameters determined dynamically by the coder are transferred, and a second part II, which essentially contains the digitized image values. The digitized image values are in this case arranged by way of example according to their index. Depending on the application, the number as well as the order of the parameters within the data set may vary. As can be seen from the table of FIG. 10, the bit depth may decrease stepwise with an advancing index, the first eight digital numbers being with a bit depth of 10 bits, the next eight with a bit depth of 9 bits, the next eight digital numbers with a bit depth of 8, etc. With a corresponding decreasing bit depth function, it is ensured that the first and therefore the most relevant signal components can be reconstructed as accurately as possible.

Figure 11:
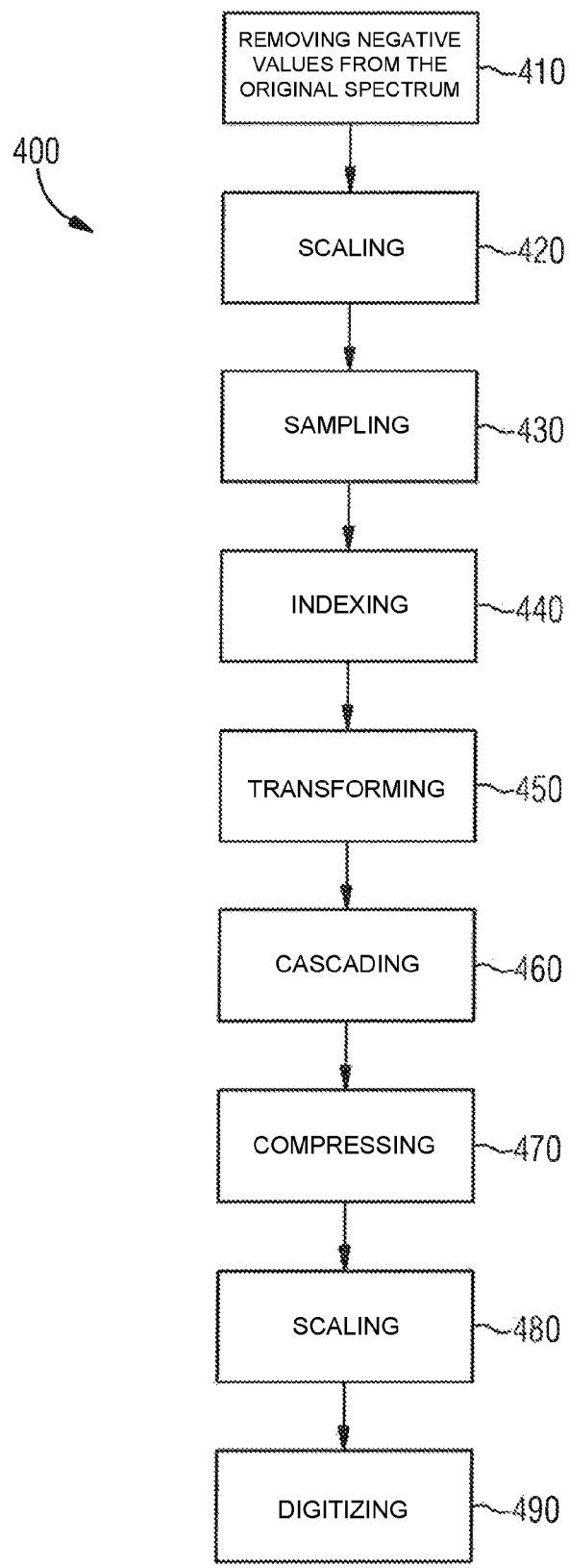
FIG. 11 shows a schematic representation of a flowchart of the coding method according to the invention.

FIG. 11 shows a schematic flowchart 400 of the present coding method, negative values initially being removed from the original spectrum in the first step 410. In the second method step 420, scaling of the power spectrum or power spectra is carried out. In the third method step 430, sampling of the source spectrum produced in this way is carried out. In the fourth method step 440, indexing of the source spectrum is carried out in order to produce a source graph. In the fifth method step 450, a transform is carried out. In the sixth method step, cascading of the transforms is optionally carried out. In the seventh method step, the image graph produced in this way is compressed, only image values less than equal to a defined threshold value index S being processed further. In the eighth method step 480, scaling of the image graph compressed in this way is optionally carried out. Lastly, in the ninth method step 490, digitizing of the image graph is carried out. The method steps shown here may vary in their order depending on the application. In particular, the first method step and the second method step may be interchanged with one another. Furthermore, the third and fourth method steps may be interchanged with one another.

Figure 12:
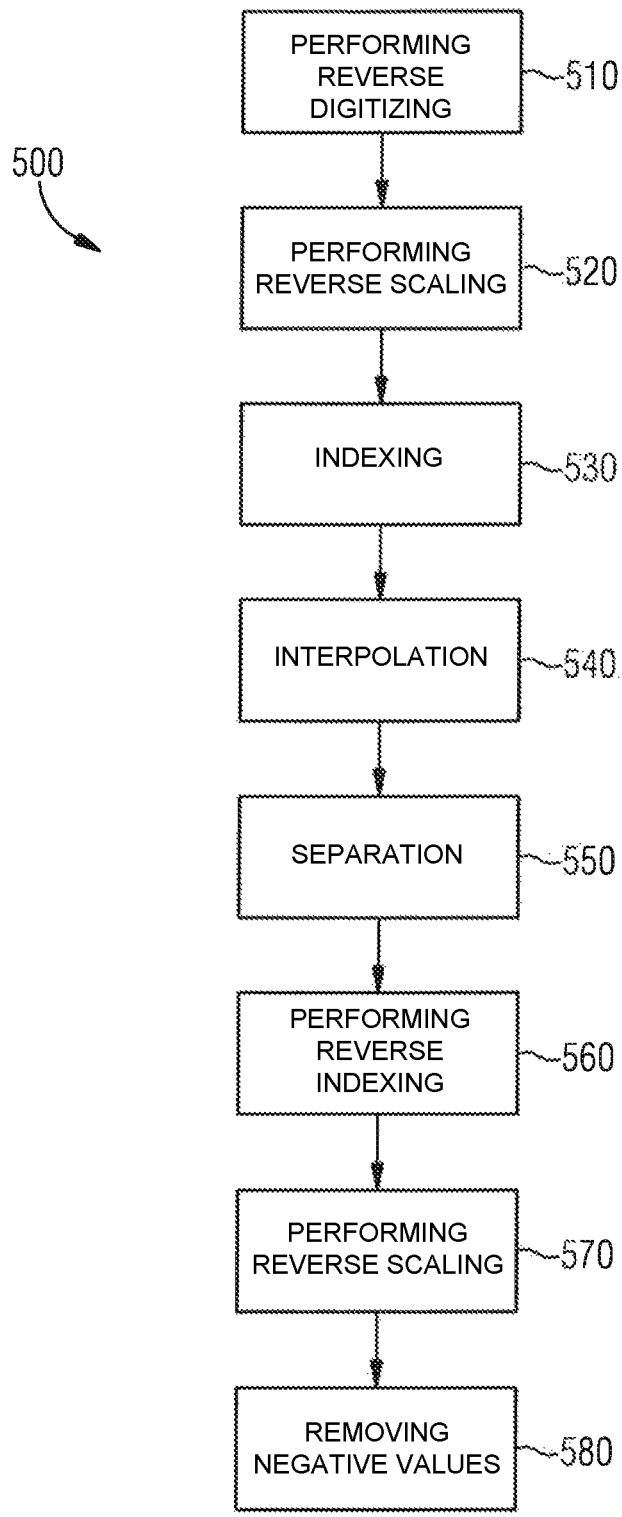
FIG. 12 shows a schematic representation of a flowchart of the decoding method according to the invention.

In order to decode the power spectrum successfully coded with the aid of the coding device, the decoder, or the decoding device, carries out the steps of the coder, or the coding device, essentially in the reverse order. In this case, the decoder uses the parameters used during the coding, parameters which are predetermined in a fixed manner in the coding method being implemented in the decoder. Parameters which are produced dynamically by the coder are communicated to the decoder, preferably with the coded data set. FIG. 12 schematically shows the sequence of a decoding process. In the first method step 510, reversal of the digitizing is initially carried out. In this case, the bit numbers are initially determined according to their bit depth assignment from the continuous bit sequence. The digital numbers determined in this way are converted into floating-point numbers. In the method step 520, reversal of the scaling is carried out, during which the scaled values preferably lying between −1 and 1 are multiplied by the corresponding envelope value.

In the subsequent method step 530, indexing is carried out, during which each reconstructed image value is assigned a corresponding image index $I_B$. In this case, it is in principle possible to produce intermediate values of the discrete image graph reconstructed in this way, by means of suitable interpolation, which after the inverse transform give particular wavelengths not present in the original source spectrum. In this case, the interpolation property of the discrete cosine transform is used in order to produce not the spectral values of the sampling wavelengths used by the coder but the spectral values for arbitrary wavelengths in the coded wavelength range. To this end, the image indices of the reconstructed image graph may be linearly interpolated according to the desired wavelength, so that under certain circumstances they no longer exist as integers. By the subsequent discrete cosine transform, the matching interpolated spectral values are produced for these indices. Thus, the decoded or reconstructed power spectrum may be produced in any desired resolution. Differences between the original spectrum and the reconstructed spectrum are, however, independent of the selected resolution.

Following the indexing step, and the interpolation optionally carried out, in the fourth method step 540 an inverse transform of the reconstructed image graph is carried out from the image range into the source range. In this case, the transform in the decoder must be matched to the transform in the coder. In particular, when using a discrete cosine transform for coding the spectral data, a discrete cosine transform which is the inverse thereof is used, the variants (I, II, III, IV) of the original discrete cosine transform respectively having to be observed. Also the use of the normalization factor the procedure in the original transform must be observed. Thus, when a normalization factor is used in the original transform, use of the normalization factor is not necessary in the inverse transform. If the normalization factor was previously used as a root, it must also be used as a root in the inverse transform. Lastly, the normalization factor must be used in the inverse transform if it was not used in the forward transform.

If cascading of the transform was carried out during the coding, the cascading must now be carried out in the reverse order. In this case, only the part of the image graph which was transformed last is initially inverse-transformed. Subsequently, further values are added and transformed together with the result of the first inverse transform in a new inverse transform. After the inverse transform has been carried out, spacer values possibly present are omitted and, in the fifth method step 550, separation of the reconstructed power spectrum into individual power spectra is carried out. In this case, the spectral values are assigned again to the individual spectra. This method step is necessary only in the case when a plurality of power spectra were originally combined to form an extended power spectrum.

In a subsequent sixth method step 560, reversal of the indexing is carried out, each spectral value being assigned the corresponding wavelength according to the indexing.

In a further method step 570, the first scaling of the power spectrum or spectra is reversed. In this case, the spectral values of a power spectrum are respectively divided by the associated scaling value. After the reverse scaling, the reconstructed power spectrum, or the reconstructed power spectra, are now available. In an optional eighth method step 580, negative values which may have been present in the reconstructed power spectrum due to decompression may be removed. In this case, the decoded spectral values which are less than zero are set equal to zero.

During the decoding as well, the order of the steps may be interchanged or rearranged in the decoder, so long as this is expedient and fulfils the function. In particular, method steps 560, 570 and 580 may be interchanged with one another. Furthermore, the reversal of the scaling 520 and the indexing or interpolation 530 may also be interchanged with one another. The decoder described here may also be integrated into the coder implementation. Thus, the decoding result of the decoder may already be compared directly with the original spectrum in the coder, so that the coder is given a possibility of assessing its own performance.

The invention has been illustrated and described in more detail with the aid of the preferred exemplary embodiments. Nevertheless, the invention is not restricted to the examples disclosed. Rather, other variants may be derived therefrom by the person skilled in the art without departing from the protective scope of the invention.

The coding method described here uses a lossy compression method, in which data are separated into a part that is important for the application and an unimportant part, and only the important part is stored. A typical unimportant part is, for example, the noise. The boundary between the important and unimportant parts is in this case generally fluid. By adapting this boundary, which is done in the exemplary embodiment described above by shifting the threshold value index along the image index scale, it is therefore possible to control the data size of the compressed data exactly. This form of compression is therefore particularly well suited for optimization of the data size with respect to a limited memory volume. The shape of the input signal, the quality of the coder and the available data volume, in this case determine the quality of the compression, i.e. the extent to which the decoded coded data match with the original data.

By the method proposed here, various spectra of an optoelectronic component can be coded. For instance, coding may be carried out by e.g. absolute spectral values, for example in W/(sr*nm). During the compression of a plurality of spectra, the ratio between the spectra is thus in particular preserved. As an alternative thereto, normalized spectra may also be coded, in which case the absolute values are lost.

Although the term "power spectrum" in the exemplary embodiment described here refers to a light power spectrum in which the radiance L is plotted against the wavelength $\lambda$, independently of the respective measurement method and application it is in principle also possible, however, to use spectra in which a different radiometric or photometric quantity is plotted against the wavelength $\lambda$, for example the total power in W/nm, maximum radiation intensity (the light power per solid angle W/(sr*nm)), irradiance (i.e. illumination of a surface in W/m$^2$*nm), etc.

The invention claimed is:

1. A coding method for compressing a power spectrum of an optoelectronic component, the method comprising:
   providing at least one power spectrum of the optoelectronic component;
   sampling the power spectrum at particular sampling wavelengths in order to produce a discrete source spectrum;
   indexing the discrete source spectrum in order to produce a source graph having discrete source values, the wavelengths being replaced by continuous source indices;
   producing an image graph having discrete image values by transforming the source graph from a source range into an image range with a discrete frequency transform;
   performing compression of the image graph, relevant and low-relevance components of the image graph being identified and the low-relevance components being eliminated from the image graph; and
   digitizing the compressed image graph in order to produce compressed spectral data, each image value of the compressed image graph being assigned a corresponding digital number having a determined bit depth.

2. The method as claimed in claim 1, wherein transforming the source graph comprises transforming the source graph with a discrete cosine transform.

3. The method as claimed in claim 1, wherein cascading of the discrete frequency transform is carried out by storing image values having low image indices of an image graph produced by the discrete frequency transform and re-transforming the remaining image values of the image graph with the discrete frequency transform.

4. The method as claimed in claim 1, wherein image values having an image index above a threshold value index are eliminated during the compression of the image graph, and wherein the threshold value index is predetermined in a fixed manner or is dynamically determined.

5. The method as claimed in claim 1, wherein spectral values of the power spectrum are multiplied by a first scaling factor before sampling, wherein the first scaling factor is a value which is constant over an entire wavelength range or a function dependent on the wavelength, and wherein the first scaling factor is established for a plurality of power spectra or is dynamically determined as a function of the respective power spectrum.

6. The method as claimed in claim 1, wherein the image values are scaled with a second scaling factor after the compression of the image graph, wherein the second scaling factor is a predetermined or dynamically determined constant value or a predetermined or dynamically determined function.

7. The method as claimed in claim 6, wherein an envelope of the compressed image graph is determined for the scaling, and wherein the image values of the compressed image graph are divided by corresponding values of the envelope.

8. The method as claimed in claim 7, wherein a logarithm of absolute values of the image values of the compressed image graph is formed for the scaling, wherein a regression line is determined with a linear regression for image values having an image index less than or equal to an threshold value index, wherein the envelope of the compressed image graph is determined by linear displacement of the regression line, and wherein the image values of the compressed image graph are divided by corresponding values of the envelope.

9. The method as claimed in claim 1, wherein sampling wavelengths which are predetermined in a fixed manner or are dynamically determined are used for the sampling, and wherein the sampling is performed with a sampling wavelength resolution which is constant or dependent on an information content of sampling points.

10. The method as claimed in claim 1, wherein negative values of the power spectrum are set to zero before the sampling.

11. The method as claimed in claim 1, wherein, in order to produce the source graph, at least two different power spectra of the optoelectronic component are combined to form an overall power spectrum and are indexed together, wherein the individual power spectra are joined to one another directly or are separated from one another by spacer values inserted before, between and/or after the individual power spectra, and wherein the individual power spectra are scaled separately or together.

12. The method as claimed in claim 1, wherein digitizing the compressed image graph comprises digitizing the compressed image graph with a constant or dynamically determined bit depth.

13. The method as claimed in claim 1, further comprising estimating an amount of data and/or a compression quality of the compressed spectral data produced by the coding method, wherein parameters of individual or multiple method steps are adapted with respect to an optimal amount of data and/or an optimal compression quality of the compressed spectral data and the corresponding method steps, or the coding method.

14. A method for decompressing a power spectrum, the method comprising:
   providing compressed spectral data of the power spectrum;
   reversing a digitizing, each digital number of the compressed spectral data respectively being assigned an image value corresponding to a respective bit depth;
   performing reverse scaling, the image values being divided by a second scaling factor;
   indexing the image values in order to reconstruct an image graph, each image value being assigned a corresponding image index;
   applying a transform which is an inverse of a discrete frequency transform to the reconstructed image graph in order to produce a reconstructed source graph;

reversing the indexing in order to produce a reconstructed source spectrum, wherein individual source indices of the reconstructed source graph are assigned corresponding wavelengths; and performing reverse scaling of the reconstructed source spectrum in order to produce a reconstructed power spectrum.

15. The method as claimed in claim 14, wherein the image values of the reconstructed image graph are interpolated in order to produce additional image values, and wherein, with the additional image values, desired intermediate values in the reconstructed power spectrum are produced by applying the transform which is the inverse of the discrete frequency transform, reversing the indexing, and reverse scaling.

16. A method for compressing and decompressing a power spectrum of an optoelectronic component, the method for compressing comprising:

providing at least one power spectrum of the optoelectronic component;

sampling the power spectrum at particular sampling wavelengths in order to produce a discrete source spectrum;

indexing the discrete source spectrum in order to produce a source graph having discrete source values, the wavelengths being replaced by continuous source indices;

producing an image graph having discrete image values by transforming the source graph from a source range into an image range with a discrete frequency transform;

performing compression of the image graph, relevant and low-relevance components of the image graph being identified and the low-relevance components being eliminated from the image graph; and digitizing the compressed image graph in order to produce compressed spectral data, each image value of the compressed image graph being assigned a corresponding digital number having a determined bit depth, and the decompressing method comprising:

reversing the digitizing, each digital number of the compressed spectral data respectively being assigned an image value corresponding to the respective bit depth;

performing reverse scaling, the image values being divided by a second scaling factor;

indexing the image values in order to reconstruct the image graph, each image value being assigned a corresponding image index;

applying a transform which is an inverse of the discrete frequency transform to the reconstructed image graph in order to produce a reconstructed source graph;

reversing the indexing in order to produce a reconstructed source spectrum, the individual source indices of the reconstructed source graph being assigned corresponding wavelengths; and performing reverse scaling of the reconstructed source spectrum in order to produce a reconstructed power spectrum.

17. The method as claimed in claim 16, wherein cascading of the discrete frequency transform is carried out by storing image values having low image indices of an image graph produced by the discrete frequency transform and re-transforming the remaining image values of the image graph with the discrete frequency transform.

18. The method as claimed in claim 16, wherein the image values are scaled with a second scaling factor after the compression of the image graph, wherein a predetermined or dynamically determined constant value or a predetermined or dynamically determined function is used as the second scaling factor, and wherein an envelope of the compressed image graph is determined for the scaling, and the image values of the compressed image graph are divided by corresponding values of the envelope.

19. The method as claimed in claim 16, wherein negative values of the power spectrum are set to zero before the sampling.

20. The method as claimed in claim 16, wherein, in order to produce the source graph, at least two different power spectra of the optoelectronic component are combined to form an overall power spectrum and are indexed together, wherein the individual power spectra are joined to one another directly or are separated from one another by means of spacer values inserted before, between and/or after the individual power spectra, and wherein the individual power spectra are scaled separately or together.

* * * * *